United States Patent
Yoon et al.

(10) Patent No.: US 9,739,817 B2
(45) Date of Patent: Aug. 22, 2017

(54) TEST BOARD AND DRIVING METHOD THEREOF

(71) Applicant: SAMSUNG DISPLAY CO., LTD., Yongin-si, Gyeonggi-do (KR)

(72) Inventors: Sang Rock Yoon, Yongin-si (KR); Hyun Il Park, Yongin-si (KR); Yeong Mook Choi, Yongin-si (KR); Jung Mi Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 15/003,484

(22) Filed: Jan. 21, 2016

(65) Prior Publication Data

US 2016/0356834 A1 Dec. 8, 2016

(30) Foreign Application Priority Data

Jun. 4, 2015 (KR) ........................ 10-2015-0079352

(51) Int. Cl.
| G01R 29/26 | (2006.01) |
| G09G 3/00 | (2006.01) |
| G09G 3/20 | (2006.01) |
| G09G 3/36 | (2006.01) |

(52) U.S. Cl.
CPC ............. *G01R 29/26* (2013.01); *G09G 3/006* (2013.01); *G09G 3/2096* (2013.01); *G09G 3/3611* (2013.01); *G09G 2330/06* (2013.01); *G09G 2350/00* (2013.01)

(58) Field of Classification Search
CPC combination set(s) only.
See application file for complete search history.

(56) References Cited

U.S. PATENT DOCUMENTS

| 7,103,800 | B2 | 9/2006 | Hasako et al. |
| 8,019,905 | B2 | 9/2011 | Wu et al. |
| 8,463,965 | B2 | 6/2013 | Park et al. |
| 2004/0218627 | A1 | 11/2004 | Kobayashi |
| 2012/0285009 | A1 | 11/2012 | Kim et al. |
| 2012/0320020 | A1 | 12/2012 | Chiba |
| 2013/0191563 | A1 | 7/2013 | Toba et al. |
| 2014/0002399 | A1 | 1/2014 | Kambhatla et al. |
| 2014/0149756 | A1 | 5/2014 | Zhong et al. |
| 2014/0152674 | A1 | 6/2014 | Koo |

FOREIGN PATENT DOCUMENTS

| JP | 2005-509379 A | 4/2005 |
| KR | 10-2009-0026893 A | 3/2009 |
| KR | 10-1166409 B1 | 7/2012 |
| KR | 10-2014-0071180 A | 6/2014 |

*Primary Examiner* — Clayton E Laballe
*Assistant Examiner* — Jas Sanghera
(74) *Attorney, Agent, or Firm* — Lewis Roca Rothgerber Christie LLP

(57) ABSTRACT

A test board between a first connector of a cable extending from a source device and a second connector of a sink device including a display panel, includes: a bypass circuit, the bypass circuit to supply a first power from a first output terminal of the first connector to a hot plug detect (HPD) input terminal of the first connector, the first power including a HPD signal.

20 Claims, 8 Drawing Sheets

TEST BOARD AND DRIVING METHOD THEREOF

CROSS-REFERENCE TO RELATED APPLICATION

This application claims priority to and the benefit of Korean Patent Application No. 10-2015-0079352, filed on Jun. 4, 2015, in the Korean Intellectual Property Office, the entire content of which is incorporated herein by reference in its entirety.

BACKGROUND

1. Field

One or more example embodiments relate to a test board and a driving method thereof.

2. Description of the Related Art

As a display apparatus becomes large and has high definition, requirements for the interface for sending signals back and forth between video source and display increases. Thus, TV sets are replaced with Vx1, and/or notebook computers having display ports (DPs).

DP interface is an interface that has been set by Video Electronics Standards Association (VESA), which may combine the existing internal standard interface (e.g., Low Voltage Differential Signaling (LVDS)) with the external connection standard (e.g., Digital Visual Interface (DVI)) into one. DP interface features technology to digitally connect all the connections including all the internal chip-to-chip connections, as well as external connections that connect product to product. Combining the two interfaces into one, and thus enlarging the data bandwidth, makes possible for better color depth and resolution.

Recently, VESA announced the specifications for a new version of the embedded Display Port (hereinafter referred to as "eDP"), which is an interface specification that corresponds to the DP interface designed for devices having embedded display devices, such as a notebook PC, a tablet, a netbook, and an all-in-one desktop PC.

A display device using the eDP interface includes a source device and a sink device. The source device transmits image data, and the sink device receives the image data and includes a display panel and a driver circuit that drives the display panel.

On the other hand, during the process of developing a display device, it may be desirable to measure the radio frequency (RF) noise of the source device, the sink device, and the cable for coupling the source device and the sink device. However, when utilizing the eDP interface, when the sink device is turned off, the source device including its cables may not operate normally, and accordingly, there may be difficulties in measuring the RF noise.

SUMMARY

Aspects of or more embodiments are directed toward a test board capable of measuring RF noise of a source device and a sink portion using eDP interface, and a method of driving the same.

According to an embodiment, a test board between a first connector of a cable extending from a source device and a second connector of a sink device including a display panel is provided, the test board including: a bypass circuit, the bypass circuit configured to supply a first power from a first output terminal of the first connector to a hot plug detect (HPD) input terminal of the first connector, the first power including a HPD signal.

In an embodiment, the bypass circuit may include a resistor and a capacitor configured to delay the supplying of the first power for a first time or longer after power is supplied to the source device, and to supply the first power to the HPD terminal.

In an embodiment, the first time may be equal to 200 ms.

In an embodiment, the first power may be equal to 3.3V.

In an embodiment, the bypass circuit may include a first switch between the first output terminal and the HPD input terminal.

In an embodiment, the test board may further include a second switch coupled between a second output terminal of the first connector and the second connector, the second output terminal being configured to output the first power.

In an embodiment, the first switch and the second switch may be implemented as a single switch.

In an embodiment, the first power output from the second output terminal may be supplied to a power supply of the sink device via the second connector, and driving of the sink device may be stopped when the second switch is turned off.

In an embodiment, the test board may further include a third switch coupled between a third output terminal of the first connector and the second connector, and the third output terminal of the first connector may be configured to output a second power that is different from the first power.

In an embodiment, the second power may be supplied to a back light source of the sink device via the second connector, and driving of the back light source may be stopped when the third switch is turned off.

In an embodiment, the second power may be equal to 12V.

In an embodiment, the source device and the sink device may be configured to transmit signals through an embedded display port (eDP) interface.

In an embodiment, the test board may include a printed circuit board including a plurality of pattern layers, and at least one pattern layer from among the plurality of pattern layers may include a ground pattern coupled to a ground power.

According to an embodiment, a method for driving a test board coupled between a first connector of a cable extending from a source device and a second connector of a sink device including a display panel is provided, the method including: supplying a first power from a first output terminal of the first connector to a hot plug detect (HPD) input terminal of the first connector, the first power including a HPD signal.

In an embodiment, the first power supplied from the first output terminal may be delayed for at least 200 ms after a power is supplied to the source device, and the first power may be supplied to the HPD input terminal.

In an embodiment, the method may further include: controlling a connection of a second output terminal of the first connector to the second connector, the second output terminal being configured to output the first power.

In an embodiment, the first power output from the second output terminal may be supplied to a power supply of the sink device.

In an embodiment, the method may further include controlling a connection of a third output terminal of the first connector to the second connector, the third output terminal being configured to output a second power that is different from the first power.

In an embodiment, the second power may be supplied to a back light source of the sink device.

In an embodiment, the source device and the sink device may transmit signals through an embedded display port (eDP) interface.

BRIEF DESCRIPTION OF THE DRAWINGS

Example embodiments will now be described more fully hereinafter with reference to the accompanying drawings. However, the present invention may be embodied in various different forms and should not be construed as limited to the embodiments set forth herein. Rather, these embodiments are provided so that this disclosure will be thorough and complete, and will fully convey the spirit and scope of the present invention to those skilled in the art.

In the drawings, the relative sizes of elements, layers, and regions may be exaggerated for clarity. Like reference numerals refer to like elements throughout.

DETAILED DESCRIPTION

Figure 1:
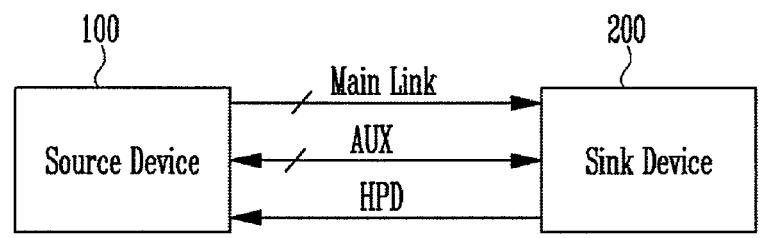
FIG. 1 is a schematic view of a display device, according to an embodiment.

In the following detailed description, only certain exemplary embodiments of the present invention have been shown and described, simply by way of illustration. As those skilled in the art would realize, the described embodiments may be modified in various different ways, all without departing from the spirit or scope of the present invention.

It will be understood that spatially relative terms, such as "beneath," "below," "lower," "under," "above," "upper," and the like, may be used herein for ease of explanation to describe one element or feature's relationship to another element(s) or feature(s) as illustrated in the figures. Accordingly, the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
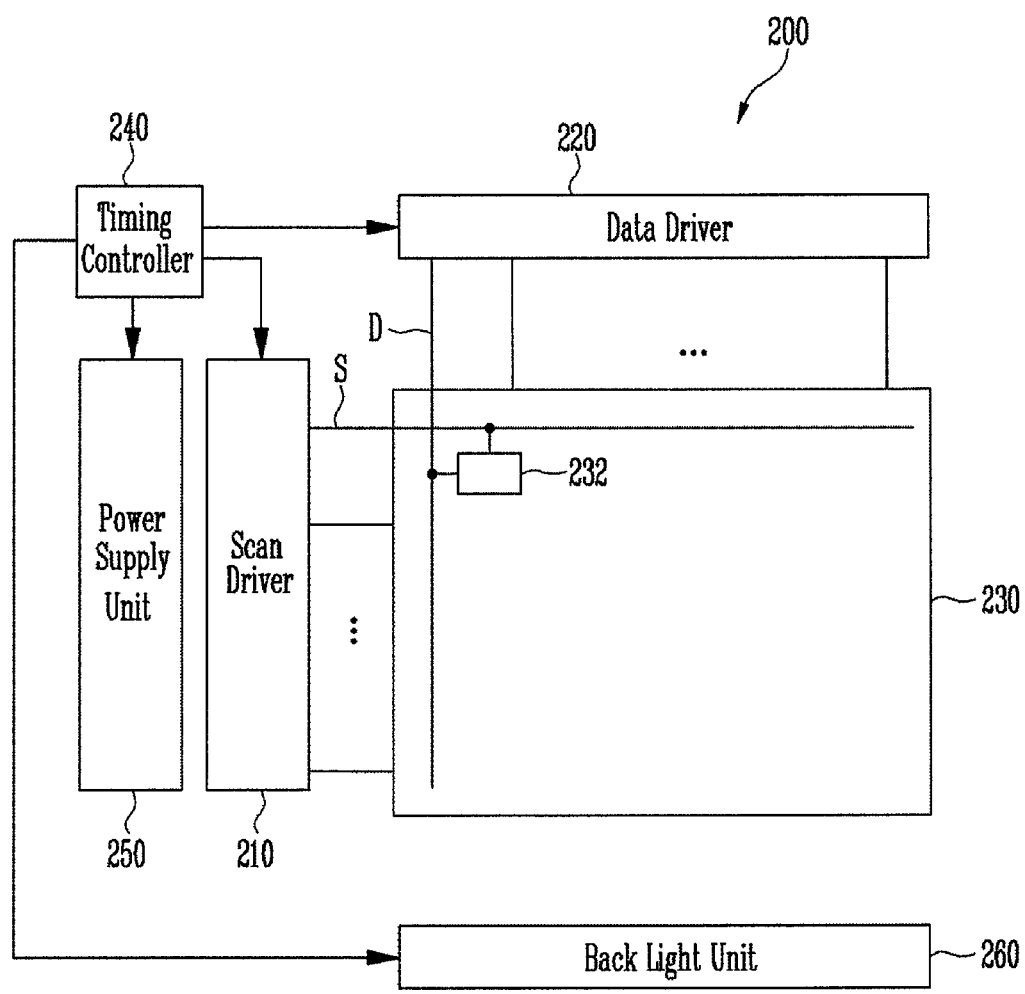
FIG. 2 is a schematic view of a sink device shown in FIG. 1, according to an embodiment.

FIG. 1 is a schematic view of a display device, according to an embodiment. FIG. 2 is a schematic view of a sink device shown in FIG. 1, according to an embodiment.

Referring to FIGS. 1 and 2, a display device according to an embodiment may include a source device 100 and a sink device 200.

The source device 100 may be a system that transmits image data, and may correspond to a transmitter Tx. For example, but without limitation thereto, the source device 100 may include a body of a notebook which includes a graphic card.

The sink device 200 may include a display panel 230, and a driver circuit unit (e.g., a driver circuit) for driving the display panel 230. Here, the driver circuit unit may include a scan driver 210, a data driver 220, and a timing controller 240. Also, the sink device 200 may further include a power supply unit (e.g., a power supply or a power source) 250 for supplying power, and a back light unit (e.g., a backlight or a backlight source) 260 for supplying light to the display panel 230.

The display panel 230 may display an image that corresponds to the image data. As for the display panel 230, panels of various forms or kinds, including a liquid crystal panel and/or an organic light emitting diode panel, may be included. If a liquid crystal panel is used as the display panel 230, the back light unit 260 for supplying light to the display panel 230 may be additionally included. However, if an organic light emitting diode panel is used as the display panel 230, the back light unit 260 for supplying light to the display panel 230 may be omitted. In FIG. 2, for convenience, the display panel 230 is described as a liquid crystal panel, and accordingly, the back light unit 260 is illustrated accordingly.

In the display panel 230, scan lines S and data lines D may be arranged, and pixels 232 may be arranged at crossing sections (or crossing areas) of the scan lines S and the data lines D. The pixels 232 may store data signals from the data lines D coupled thereto, and the data lines D may be selected on a horizontal line basis corresponding to the scan signals supplied to the scan lines S. The pixels 232 may display an image while controlling the amount of penetrating light from the back light unit 260 in response to the data signals.

The scan driver 210 may supply scan signals to the scan lines S in response to control by the timing controller 240. For example, but without limitation thereto, the scan driver 210 may supply scan signals to the scan lines S sequentially. When the scan signals are supplied sequentially to the scan lines S, the pixels 232 may be selected on a horizontal line basis.

The data driver 220 generates data signals using the image data supplied from the timing controller 240. The data driver 220 may supply the generated data signals to the data lines D, such that the generated data signals are synchronized with the scan signals. The data signals supplied to the data lines D may be transmitted to the pixels 232 selected by the scan signals.

The timing controller 240 may correspond to a receiver Rx, which receives image data from the source device 100. The timing controller 240 may rearrange the image data, and may supply the rearranged image data to the data driver 220. Also, the timing controller 240 may control the scan driver 210 and the data driver 220.

The power supply unit 250 may supply power that is utilized for driving the sink device 200. The power supply unit 250 may receive power from the source device 100 via the timing controller 240.

The back light unit 260 may supply light to the display panel 230. The back light unit 260 may receive power from the source device 100 via the timing controller 240.

The source device 100 and the sink device 200 may communicate through the eDP interface. For this purpose, a hot plug detect (HPD) channel, an AUX channel, and a Main Link channel may be provided between the source device 100 and the sink device 200.

Figure 3:
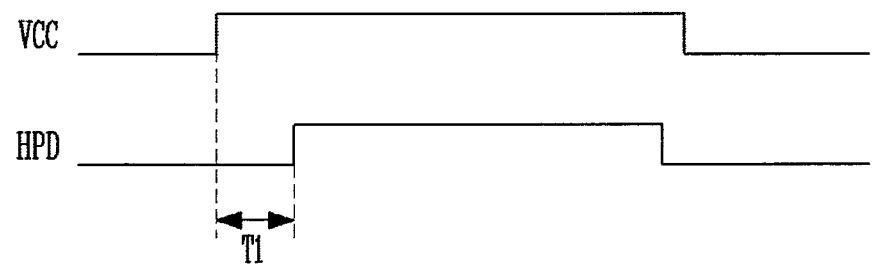
FIG. 3 illustrates HPD signal according to an eDP interface.

The HPD channel may be used to supply HPD signals. In further detail, the HPD signals from the sink device 200 may be supplied to the source device 100 after at least a first time T1 after the power VCC is input into the display device as shown in FIG. 3. In the eDP interface, normal communication between the source device 100 and the sink device 200 is possible when (e.g., only after) the HPD signals are supplied from the sink device 200 to the source device 100. In an example embodiment, the first time T1 may be equal to or substantially equal to 200 ms.

The AUX channel is used to transmit signals that are utilized to control and set environment settings in the eDP interface. For example, but without limitation thereto, once the source device 100 receives the HPD signals from the sink device 200, it may transmit various control signals to the sink device 200 using the AUX channel.

The Main Link channel is used to send image data. When the settings are set in the eDP interface, the source device 100 may transmit the image data to the sink device 200 using the Main Link channel.

The source device 100 may include cables for the HPD channel, the AUX channel, and the Main Link channel between the source device 100 and the sink device 200. In order to isolate the cause of occurrence of the RF noise during the developing stages, it may be desirable to measure the source device 100, the cable extending from the source device 100, and the RF noise of the sink device 200.

Figure 4:
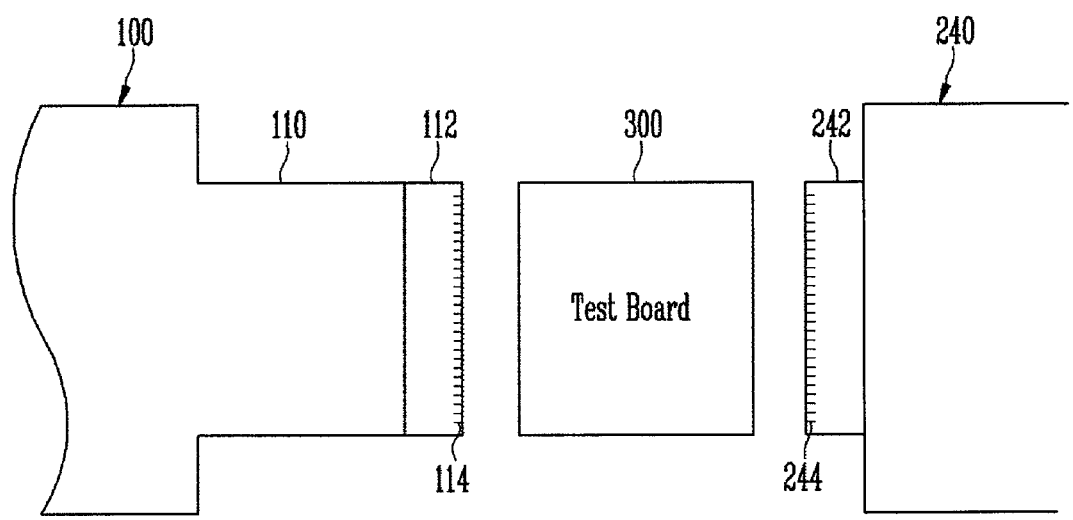
FIG. 4 is a schematic view of a test board, according to an embodiment.

FIG. 4 schematically illustrates a test board, according to an embodiment.

Referring to FIG. 4, the cable 110 may extend from the source device 100. At an end of the cable 110 (e.g., an opposite end from the source device), there may be a first connector 112 for coupling to the sink device 200. The first connector 112 may include a plurality of pins 114 corresponding to the eDP interface.

A second connector 242 that may be coupled to the first connector 112 may be provided at the sink device 200, e.g., at the timing controller 240. The second connector 242 may include a plurality of pins 244 corresponding to the eDP interface.

The test board 300 may be coupled between the first connector 112 and the second connector 242. The test board 300 may be used to measure the RF noise. For example, the test board 300 may control turn-on and turn-off of the sink device 200. Also, the test board 300 may allow the source device 100 to operate normally when the sink device 200 is turned-off (e.g., in a turn-off state), by supplying the HPD signals to the source device 100 via the first connector 112.

As for a process of measuring the RF noise, the RF noise of the source device 100 excluding the cable 110 may be first measured. For example, but without limitation thereto, the RF noise of the graphic processing unit (GPU) included in the source device 100 may be measured. When the RF noise of the source device 100 is measured, the sink device 200 may be turned-off (e.g., in a turn-off state).

Thereafter, the RF noise of the cable 110 may be measured while supplying the HPD signals to the first connector 112 by the test board 300. Here, the RF noise of the source device 100 and the RF noise of the cable 110 are measured concurrently (e.g., simultaneously or at the same time), since the source device 100 operates normally. Additionally, while the RF noise of the cable 110 is being measured, the sink device 200 may be turned-off (e.g., in a turn-off state) by the test board 300.

After the RF noise of the cable 110 is measured, the sink device 200 may be turned-on (e.g., set to turn-on or be in a turn-on state) using the test board 300. The RF noise is measured when the sink device 200 is turned-on (e.g., in a turn-on state). Here, since the sink device 200 operates normally, the RF noises of the source device 100, the cable 110, and the sink device 200 may be measured together.

Figure 5:
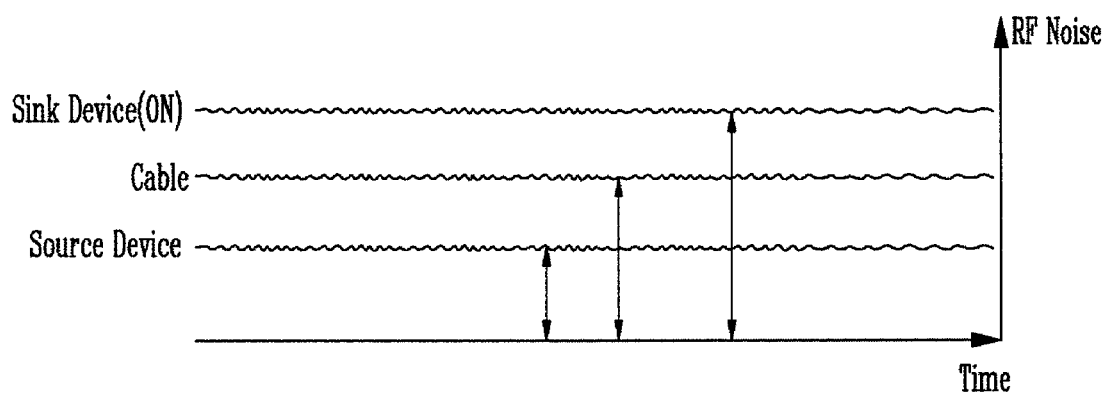
FIG. 5 is a graph illustrating RF noise measured by the test board shown in FIG. 4.

When the RF noise is measured through the above-described process, as shown in FIG. 5, the RF noise of each of the source device 100, the cable 110, and the sink device 200 may be measured and examined, as shown in FIG. 5, and efficient design and development may be possible. For example, but without limitation thereto, when removing the RF noise of the source device 100 from the RF noise up to the cable 110, the RF noise of the cable 110 may be known or predicted. Similarly, if the RF noise from up to the sink device 200 to the RF noise up to the cable 110 is removed, the RF noise of the sink device 200 itself may be known or predicted.

Additionally, the test board 300 may control the driving of the back light unit 260. For example, but without limitation thereto, the test board 300 may detect a defect of the back light unit 260 while controlling the power supply of the back light unit 260.

Figure 6:
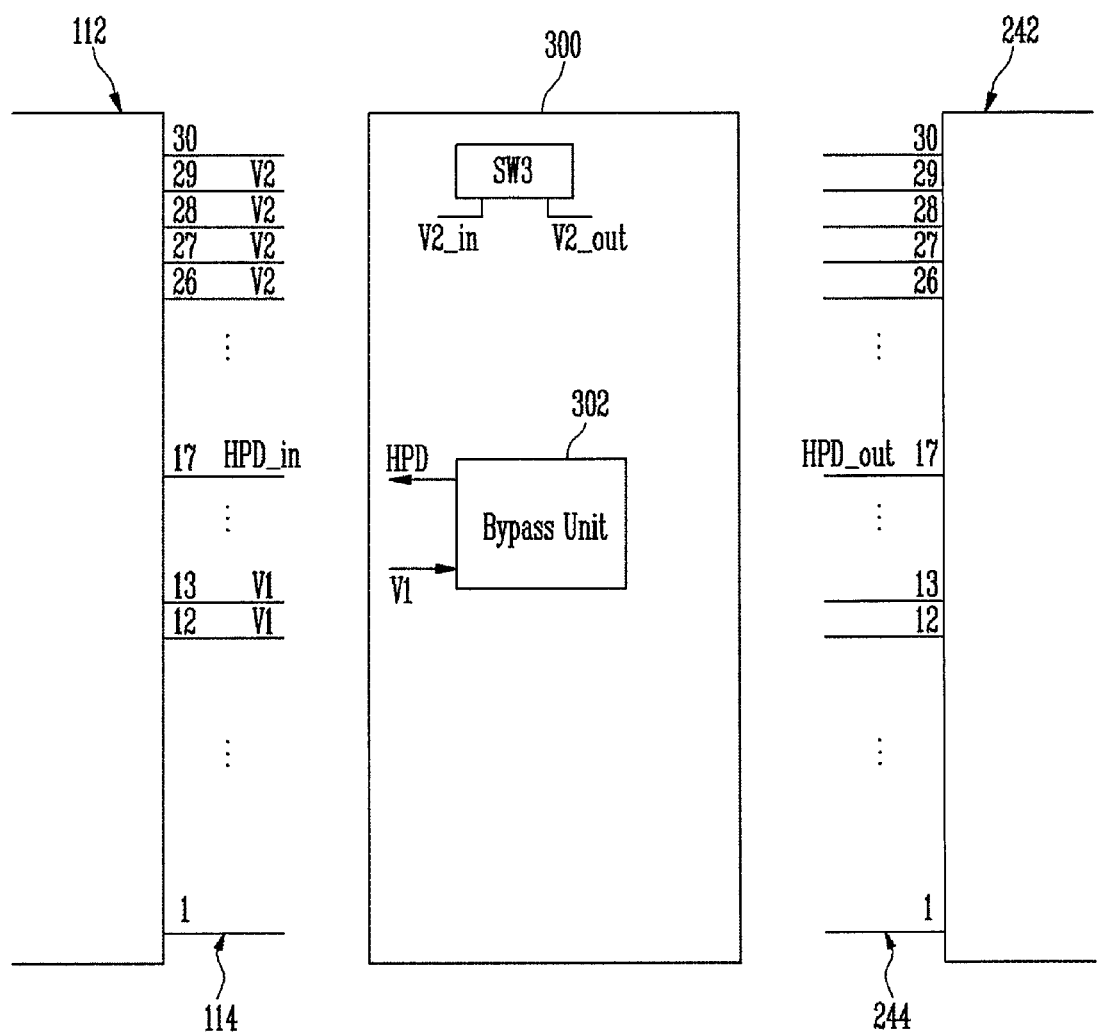
FIG. 6 illustrates an embodiment of a test board shown in FIG. 4.

FIG. 6 illustrates an embodiment of the test board shown in FIG. 4.

Referring to FIG. 6, the first connector 112 may include, for example, 30 pins corresponding to the eDP interface. Any one pin from among the plurality of pins 114 included in the first connector 112, e.g., pin 17, may be used as a HPD input terminal HPD_in. The HPD input terminal HPD_in may receive HPD signals from the sink device 200 via the test board 300 or the second connector 242.

The HPD signal may include a voltage (e.g., a set or predetermined voltage). For example, but without limitation thereto, the HPD signal may be set to a voltage of a first power V1. Here, the voltage of the first power V1 may be set to, for example, 3.3V.

The pins 114 of the first connector 112 may include pins for outputting a voltage of the first power V1 (e.g., pins 12 and 13), and pins for outputting a second power V2 (e.g., pins 26, 27, 28, and 29). Here, the first power V1 may be used for a driving power of a power device 250, and the second power V2 may be used for a driving power of the back light unit 260. Additionally, the second power V2 may be set to, for example, 12V.

The plurality of pins 244 included in the second connector 242 correspond to the pins 114 of the first connector 112. In other words, the HPD output terminal HPD_out (e.g., pin 17) is included in the second connector 242. Also, the second connector 242 may include pins that receive the first power V1 (e.g., pins 12 and 13), and pins that receive the second power V2 (e.g., pins 26, 27, 28, and 29). The first power V1 that is input to the second connector 242 may be input as the driving power of the power supply unit 250 via the timing controller 240. The second power V2 that is input to the second connector 242 may be input as the driving power of the back light unit 260 via the timing controller 240.

The test board 300 is provided between the first connector 112 and the second connector 242. The test board 300 may include a bypass unit (e.g., a bypass circuit) 302 and a third switch SW3. The bypass unit 302 may be coupled between a first output terminal (e.g., pin 12 or 13 of the first connector 112) for outputting the first power V1 and the HPD input terminal HPD_in (e.g., pin 17).

The bypass unit 302 supplies the first power V1 from the first output terminal to the HPD input terminal HDP_in. The first power V1 which is supplied to the HPD input terminal HPD_in may be an HPD signal, and therefore, the source device 100 operates normally. That is, even when the sink device 200 is turned off, or when the second connector 242 is not connected to the test board 300, the source device 100 may operate normally through the bypass unit 302. For example, but without imitation thereto, if the test board 300 is not coupled to the second connector 242, when the first power V1 is supplied to the HPD input terminal HPD_in using the bypass unit 302, the source device 100 operates normally. While the first power V1 is being input to the HPD input terminal HPD_in, the sink device 200 may be turned-off (e.g., in a turn-off state), and the RF noises of the source device 100 and the cable 110 may be measured.

Additionally, for reliable driving, the bypass unit 302 may supply the first power V1 from the first output terminal to the HPD input terminal HPD_in after at least a first time T1 after power is input.

The third switch SW3 may be coupled between a third output terminal for outputting the second power V2 (e.g., any one of pins 26 to 29 of the first connector 112) and a first input terminal (e.g., any one of pins 26 to 29 of the second connector 242). The third switch SW3 may control the connection between the third output terminal and the first input terminal.

If the third switch SW3 is turned on, the third output terminal and the first input terminal are coupled to each other, and accordingly, the driving power is supplied to the back light unit 260. When the driving power is supplied to the back light unit 260, the back light unit 260 may operate normally and may emit light. That is, whether the back light unit 260 operates normally may be determined by using the third switch SW3. Also, the RF noise may be additionally measured by the back light unit 260, while controlling the operation of the back light unit 260.

Figure 7:
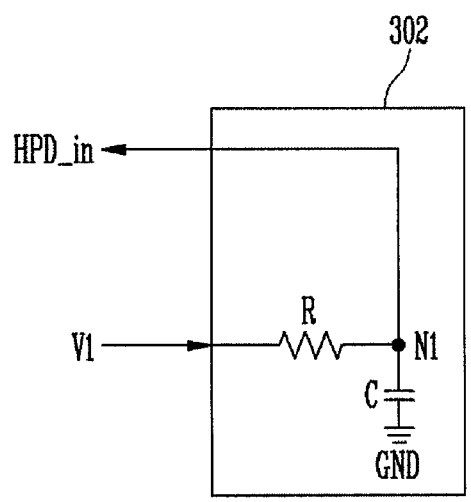
FIG. 7 illustrates an embodiment of a bypass unit shown in FIG. 6.

FIG. 7 illustrates an embodiment of a bypass unit (e.g., a bypass circuit) shown in FIG. 6.

Referring to FIG. 7, the bypass unit 302 in accordance with an embodiment may include a resistor R and a capacitor C. The resistor R may be coupled between the first output terminal and a first node N1. The capacitor C may be coupled between the first node N1 and a ground GND, and the first node N1 may be connected to the HPD input terminal HPD_in.

The resistor R and the capacitor C may function as a delay unit, which supplies the first power V1 from the first output terminal to the HPD input terminal HPD_in after a delay for a duration of the first time T1 or longer. Accordingly, the resistance value of the resistor R and the capacitance of the capacitor C may be determined empirically, such that the first power V1 may be delayed for at least the duration of the first time T1.

Figure 8:
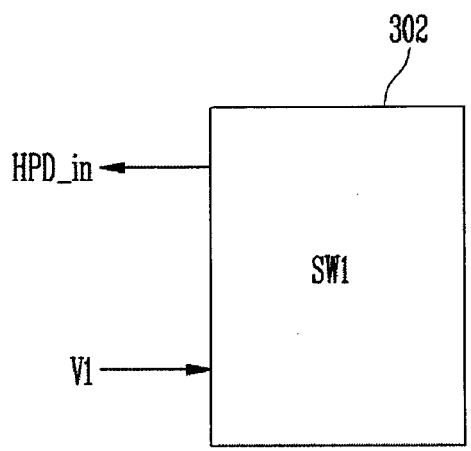
FIG. 8 illustrates another embodiment of the bypass unit shown in FIG. 6.

FIG. 8 illustrates another embodiment of the bypass unit shown in FIG. 6.

Referring to FIG. 8, in another embodiment, the bypass unit 302 may be implemented with a first switch SW1. The first switch SW1 may be provided between the first output terminal and the HPD input terminal HPD_in. The first switch SW1 may control connection between the first output terminal and the HPD input terminal HPD_in corresponding to control of a user. When the first output terminal and the HPD input terminal HPD_in are coupled to each other by the first switch SW1, the source device 100 can operate normally, since the first power V1 is supplied to the HPD input terminal HDP_in.

Figure 9:
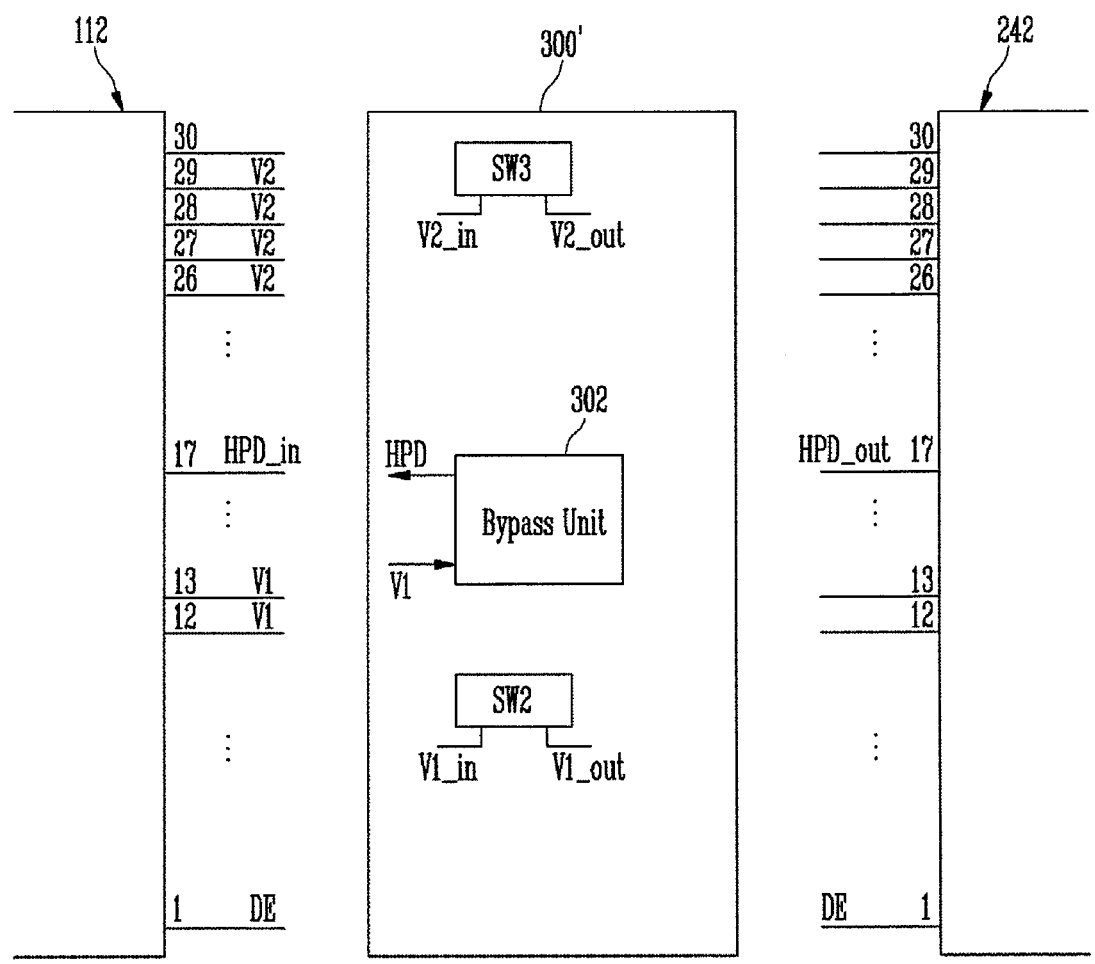
FIG. 9 illustrates another embodiment of a test board shown in FIG. 4.

FIG. 9 illustrates another embodiment of the test board shown in FIG. 4. In describing FIG. 9, with reference to the same or substantially the same components as FIG. 6, the same reference numerals will be used and detailed description thereof will be omitted.

Referring to FIG. 9, the test board 300' according to another embodiment may additionally include a second switch SW2. The second switch SW2 may be coupled between a second output terminal for outputting the first power V1 (e.g., any of the pins configured to output the first power V1 of the first connector 112) and a second input terminal (e.g., a corresponding pin of the second connector 242). Here, the second output terminal may be a terminal different from the first output terminal. For example, but without limitation thereto, if pin 12 of the first connector 112 is used for the first output terminal, then pin 13 of the first connector 112 may be used for the second output terminal. Accordingly, if pin 13 of the first connector 112 is used for the second output terminal, then pin 13 of the second connector 242 may be used for the second input terminal.

The second switch SW2 may control the connection between the second output terminal and the second input terminal. When the second switch SW2 is turned on, the second output terminal and the second input terminal are connected to each other, and accordingly, the driving power may be supplied to the power supply unit 250. When the driving power is supplied to the power supply unit 250, the sink device 200 may be turned-on by the power generated from the power supply unit 250. That is, when the driving power is supplied to the power supply unit 250, the display panel 230 may normally operate.

If the second switch SW2 is turned off, the second output terminal and the second input terminal may be electrically cut off (e.g., electrically disconnected form each other). In this case, the driving power is not supplied to the power supply unit 250, and accordingly, the sink device 200 may be turned-off.

That is, the turn-on and the turn-off of the sink device 200 may be controlled by including the second switch SW2 in the test board 300' according to another embodiment. Therefore, the RF noises of the cable 110 and the sink device 200 may be measured, even when the connection of the test board 300' and the second connector 242 is maintained.

Figure 10:
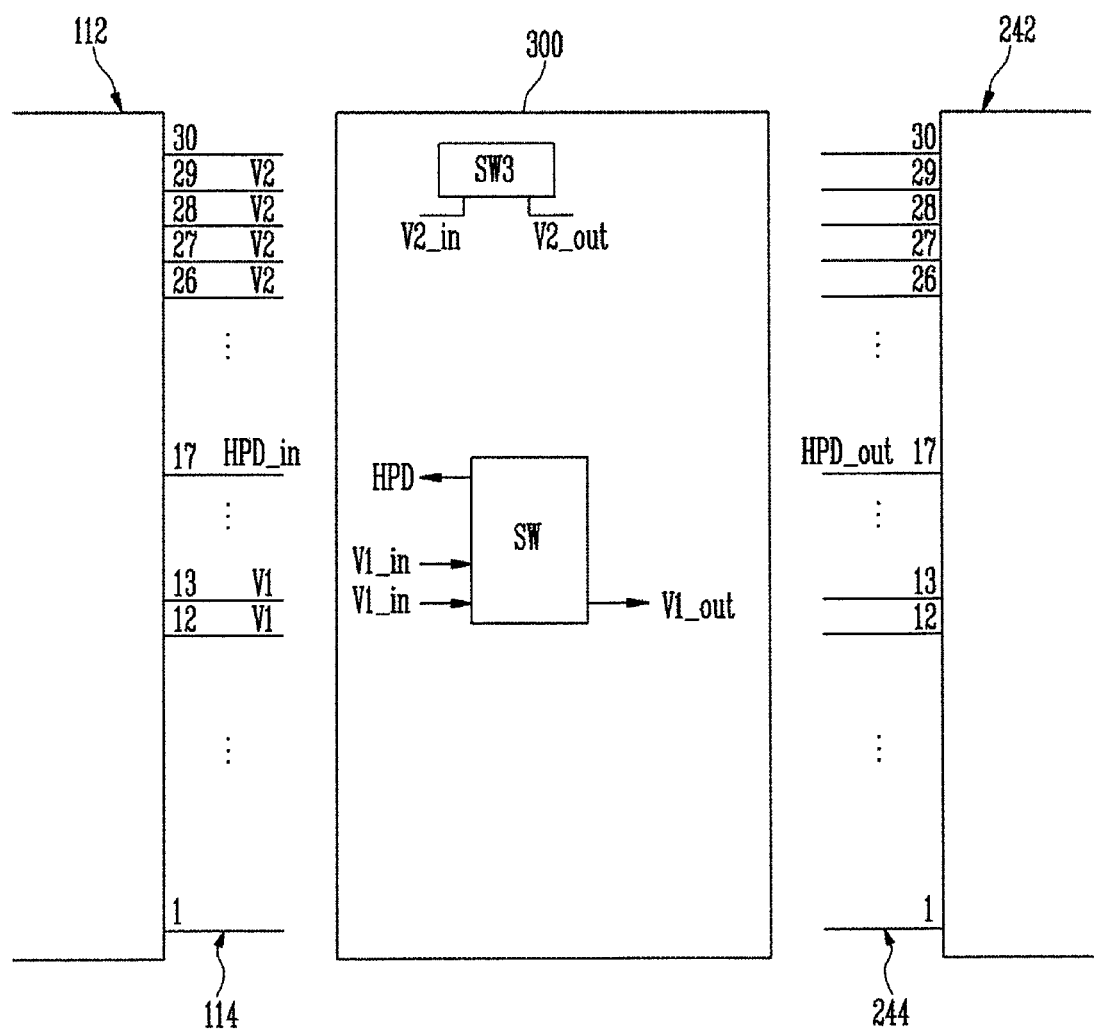
FIG. 10 illustrates another embodiment of switches shown in FIGS. 8 and 9.

When the bypass unit 302 is configured as the first switch SW1 as shown in FIG. 8, the first switch SW1 and the second switch SW2 may be arranged to be adjacent to each other. In this case, as shown in FIG. 10, in some embodiments, the first switch SW1 and the second switch SW2 may be replaced with one switch SW.

The switch SW controls the connection between the first output terminal and the HPD input terminal HPD_in, and the connection between the second output terminal and the second input terminal. Accordingly, functions of the first switch SW1 and the second switch SW2 may be integrated (e.g., performed) by the switch SW.

Figure 11:
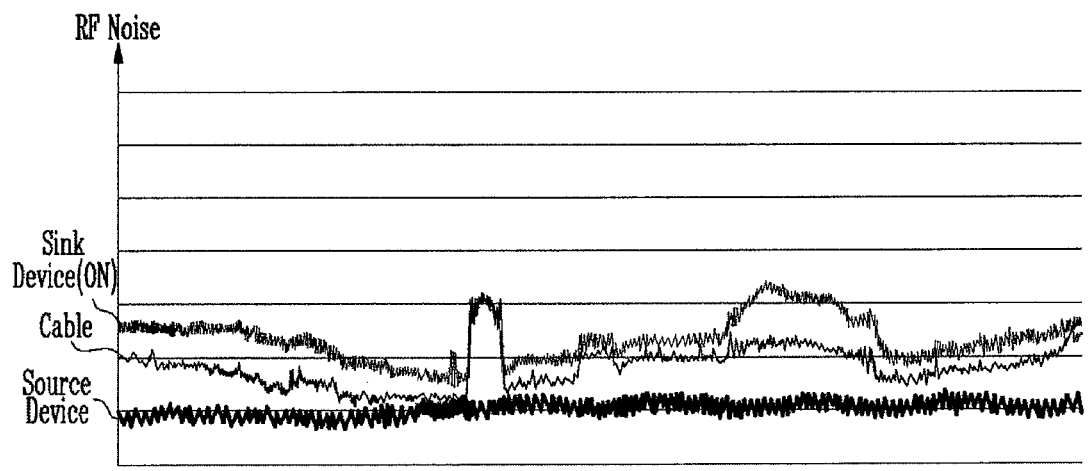
FIG. 11 illustrates a graph showing RF noise that is measured using the test board.

FIG. 11 illustrates a graph showing RF noise that is measured using the test board. Referring to FIG. 11, when the test board 300 and/or 300' is used, even in the eDP interface, the RF noises of the source device 100, the cable 110, and the sink device 200 can be measured (e.g., stably measured). In this case, the cause of occurrence of the RF noise may be accurately analyzed, and accordingly, development costs and development time may be reduced.

Figure 12:
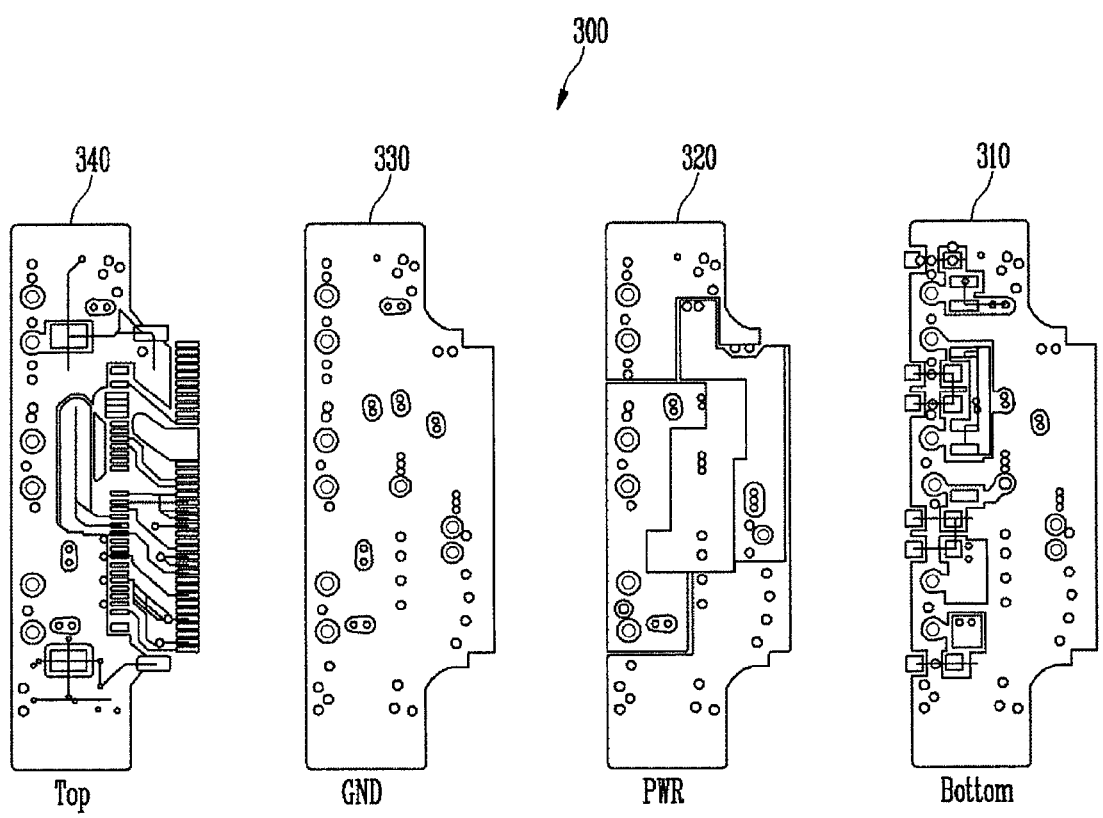
FIG. 12 illustrates an implementation of the test board, according to an embodiment.

FIG. 12 illustrates an implementation of the test board, according to an embodiment.

Referring to FIG. 12, the test board 300 and/or 300' may be implemented with a printed circuit board that includes a plurality of pattern layers.

Electronic components including switches may be mounted on a first pattern layer 310. At a fourth pattern layer 340, wires for connecting the electronic components may be formed. At a second pattern layer 320, power wires may be formed. At a third pattern layer 330, ground patterns that are coupled to a ground power may be included. Here, the ground patterns may remove EMI noise interference between the second pattern layer 320 and the fourth pattern layer 340. That is, the ground patterns may be disposed in at least one pattern layer from among the plurality of pattern layers, and accordingly, deterioration in reliability due to noise interference may be prevented or reduced.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present invention as set forth in the following claims, and their equivalents.

What is claimed is:

1. A test board between a first connector of a cable extending from a source device and a second connector of a sink device including a display panel, the test board comprising:
 a bypass circuit, the bypass circuit configured to supply a first power from a first output terminal of the first connector to a hot plug detect (HPD) input terminal of the first connector, the first power including a HPD signal.

2. The test board as claimed in claim 1,
wherein the bypass circuit comprises a resistor and a capacitor configured to delay the supplying of the first power for a first time or longer after power is supplied to the source device, and to supply the first power to the HPD input terminal.

3. The test board as claimed in claim 2, wherein the first time is equal to 200 ms.

4. The test board as claimed in claim 1, wherein the first power is equal to 3V.

5. The test board as claimed in claim 1, wherein the bypass circuit comprises a first switch between the first output terminal and the HPD input terminal.

6. The test board as claimed in claim 5 further comprising a second switch coupled between a second output terminal of the first connector and the second connector, the second output terminal being configured to output the first power.

7. The test board as claimed in claim 6, wherein the first switch and the second switch are implemented as a single switch.

8. The test board as claimed in claim 6, wherein the first power output from the second output terminal is to be supplied to a power supply of the sink device via the second connector,
wherein driving of the sink device is to be stopped when the second switch is turned off.

9. The test board as claimed in claim 1 further comprising a third switch coupled between a third output terminal of the first connector and the second connector, wherein the third output terminal of the first connector is configured to output a second power that is different from the first power.

10. The test board as claimed in claim 9,
wherein the second power is to be supplied to a back light source of the sink device via the second connector, and
wherein driving of the back light source is to be stopped when the third switch is turned off.

11. The test board as claimed in claim 9, wherein the second power is equal to 12V.

12. The test board as claimed in claim 1, wherein the source device and the sink device are configured to transmit signals through an embedded display port (eDP) interface.

13. The test board as claimed in claim 1, wherein the test board comprises a printed circuit board including a plurality of pattern layers, and
wherein at least one pattern layer from among the plurality of pattern layers includes a ground pattern coupled to a ground power.

14. A method for driving a test board coupled between a first connector of a cable extending from a source device and a second connector of a sink device including a display panel, the method comprising:
supplying a first power from a first output terminal of the first connector to a hot plug detect (HPD) input terminal of the first connector, the first power including a HPD signal.

15. The method as claimed in claim 14, wherein the first power supplied from the first output terminal is delayed for at least 200 ms after a power is supplied to the source device, and the first power is supplied to the HPD input terminal.

16. The method as claimed in claim 14, further comprising:
controlling a connection of a second output terminal of the first connector to the second connector, the second output terminal being configured to output the first power.

17. The method as claimed in claim 16, wherein the first power output from the second output terminal is supplied to a power supply of the sink device.

18. The method as claimed in claim 14 further comprising controlling a connection of a third output terminal of the first connector to the second connector, the third output terminal being configured to output a second power that is different from the first power.

19. The method as claimed in claim 18, wherein the second power is supplied to a back light source of the sink device.

20. The method as claimed in claim 14, wherein the source device and the sink device transmit signals through an embedded display port (eDP) interface.

* * * * *